Nov. 12, 1968 M. P. LEPSELTER 3,411,048
SEMICONDUCTOR INTEGRATED CIRCUITRY WITH IMPROVED ISOLATION
BETWEEN ACTIVE AND PASSIVE ELEMENTS
Filed May 19, 1965

INVENTOR
M. P. LEPSELTER
BY H.W. Lockhart
ATTORNEY

United States Patent Office 3,411,048

Patented Nov. 12, 1968

3,411,048

SEMICONDUCTOR INTEGRATED CIRCUITRY WITH IMPROVED ISOLATION BETWEEN ACTIVE AND PASSIVE ELEMENTS

Martin P. Lepselter, New Providence, N.J., assignor to Bell Telephone Laboratories, Incorporated, New York, N.Y., a corporation of New York Filed May 19, 1965, Ser. No. 457,083
5 Claims. (Cl. 317—234)

ABSTRACT OF THE DISCLOSURE

A passive electric element is mounted in close proximity to other elements of a semiconductor integrated circuit by forming a thin film resistor or capacitor on a thin web of silicon oxide suspended between, and wholly supported by, heavy metal interconnection members of the beam lead type which are not only self-supporting but also supportive of the semiconductor elements comprising the device. Such a thin oxide web is formed by selective etching methods.

Figure 1:
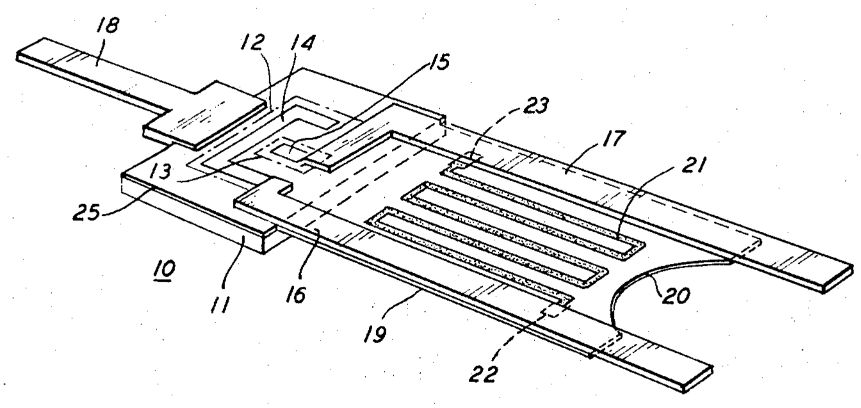

This invention relates to semiconductor integrated circuit devices and particularly to passive and active electric circuit elements in combination in a unitary structure.

Integrated circuits combining active semiconductor devices, such as transistors and diodes in combination with passive elements, including resistors and capacitors, are well-known and comprise a rapidly developing art at the present time. In general, one form of integrated structure comprises a monolithic block of semiconductor material such as silicon within which is formed an array of transistors and diodes, typically by chemical processing. Passive elements then are formed on the surface of the monolithic block, for example, by well-known thin film deposition techniques. The various elements conveniently are electrically connected by means of metal film patterns to produce the desired circuit configuration. One form of integrated circuit device is disclosed in my Patent No. 3,335,338, issued August 8, 1967.

However, one drawback in connection with the formation of passive thin film elements directly on the surface of the semiconductor substrate and separated only by the thickness of an oxide insulating layer, has been the existence of undesirable electrical coupling between the passive element and the substrate. Typically, in the case of thin film resistors and capacitors, a considerable capacitive coupling is exhibited between the element and its adjoining substrate portion.

Accordingly, an object of this invention is a structural arrangement enabling an integrated circuit without the undesirable electrical coupling between the passive elements and the active substrate.

In my copending application, referred to above, and in my Patent No. 3,287,612, issued November 22, 1966, arrangements are disclosed for fabricating and using beam-lead semiconductor devices comprising both single elements and integrated semiconductor device circuits. In general, these structures are achieved by producing relatively heavy metal film patterns for interconnecting the deposited metal electrodes on the semiconductor devices. These heavy metal patterns form self-supporting metal beam leads when adjoining semiconductor substrate material is removed to isolate the circuit portions. Thus, such beam leads are characterized as conductive metallic interconnection members substantially in one plane and of sufficient thickness to independently support the isolated portions of semiconductor material which comprise the device. In particular, the monolithic blocks, typically of silicon, first are masked from the reverse side, or side opposite that upon which the electrodes and metal patterns have been applied. Etching is then carried out selectively from this masked surface to remove silicon semiconductor material, as is disclosed in my previous applications referred to above. The etching process is selective in that the etchant used is so much slower in attacking the silicon oxide which covers all but the contact portions of the electroded surface of the device that the process effectively terminates when the silicon material has been removed.

Consequently, at the conclusion of the silicon removal process large areas of the silicon oxide film remain as web-like portions in self-supporting relation, between the projecting beam-lead members and the now isolated portions of the semiconductor material. Although this silicon oxide web may have a thickness of only about one micron, it exhibits considerable mechanical strength and, in particular, sufficient to carry a thin film resistor or capacitor deposited thereon. Thus, an arrangement is provided in which the passive element is mounted in close proximity to other elements of the integrated circuit while, at the same time, avoiding the capacitive coupling of previous structures, inasmuch as the semiconductor substrate is no longer present beneath the passive element.

Moreover, in addition to its use as a mounting surface for passive elements, the oxide web may also be used as a vibratory member for acoustic elements such as microphone diaphragms or, when suitably treated, as a modulator for light beam incident upon, for example, a mirror surface coated on the oxide web.

Figure 2:
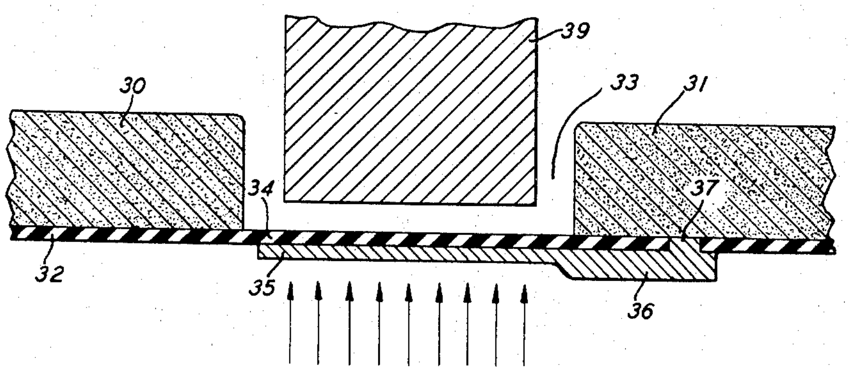

The invention and its other objects and features will be more clearly understood from the following detailed description taken in connection with the drawings in which:

FIG. 1 is a perspective view of a beam-lead transistor and an integrated thin film resistor mounted on the oxide web in accordance with this invention, and FIG. 2 is a schematic sectional view of a portion of a semiconductor integrated circuit device showing the oxide web, in accordance with this invention, used as the diaphragm for a microphone.

In FIG. 1 there is illustrated a simple integrated circuit structure 10 comprising a transistor of the diffused junction, planar type having beam leads, and a thin film resistor connected between the emitter and base leads of the transistor. The transistor portion of the device comprises a silicon wafer 11 having diffused base and emitter zones whose boundaries are defined by the broken lines 12 and 13, respectively, on the upper face of the wafer. As is well-known in the art. the base zone which is of greater extent, is diffused to a slightly greater depth into the wafer than is the emitter zone 13. The portion of the wafer outside of the base zone boundary 12 and beneath the base zone constitutes the collector zone.

Substantially ohmic or low resistance contacts to the several zones of the transistor are provided by deposited metal electrodes. In particular, the electrode 14 is applied to the base zone and electrode 15 to the emitter zone. Similar contact is provided to the collector zone by the electrode 18. External connections to the base and emitter electrodes are provided by the beam-lead connections 16 and 17, respectively. The collector electrode in this instance comprises a beam lead 18 in its entirety.

The upper surface of the wafer 11 is completely covered except for the emitter, base, collector electrode regions by a thin layer of silicon oxide 25. This layer underlies the heavy beam leads 16 and 17 where they are deposited on the surface of the wafer 11 as well as being adherent and suspended beneath the projections of these two leads. In this projecting portion the oxide film exists as a web 20 between the two leads 16 and 17. On the upper surface of the web 20 is a thin film resistance element 21 having terminals 22 and 23 connected to the base and emitter beam leads 16 and 17, respectively. The resistance element 21 is of the type produced by the deposition of a film-forming metal such as tantalum.

Thus the resistance element 21 is supported in close proximity to the active device portion of an integrated structure, but does not have an underlying substrate which is electrically a part of such integrated structure. Thus the configuration may be designed and fabricated without concern for the capacitive coupling customarily exhibited when a passive element, such as resistor 21, is deposited on the oxide film overlying the semiconductor substrate. In this connection it will be appreciated that this illustration is of the simplest kind of integrated structure and that the advantages of this invention are applicable to even more complex arrangements where larger areas of the oxide web may be available around the periphery or between separated semiconductor substrate portions. In particular, reference is made to my Patent No. 3,335,338, issued August 8, 1967, referred to above and to the copending application of B. T. Murphy, Ser. No. 429,345, filed Feb. 1, 1965, and assigned to the assignee hereof, for examples of more complex intergrated device structures utilizing the beam-lead technique.

The semiconductor device structure 10 of FIG. 1, referred to in my Patent No. 3,287,612, issued November 22, 1966, as the linear transistor type, is fabricated in accordance with the procedures disclosed in that application. Generally, the techniques for making diffused junction, planar devices using oxide masking are well-known. Further, this particular transistor structure is fabricated using a multiple layer deposition to produce the beam leads 16, 17 and 18 as is also disclosed in my applications noted above.

In connection with this particular invention however, several alternative procedures are available for producing the passive element 21 on the oxide web 20. In particular, for either a resistor or capacitor a film-forming metal may be deposited which is identical with the initial complete metal layer, specifically titanium deposited as taught in connection with my beam-lead structures. Examples of thin film devices are disclosed in United States patents, No. 3,148,129 to H. Basseches, P. L. McGeough and D. A. McLean; No. 3,159,556 to D. A. McLean and W. J. Pendergast and No. 2,993,266 to R. W. Berry. In particular, in one alternative technique, the titanium may be deposited over the entire oxide surface and then selectively removed to define the resistive element 21 on the web 20, which then is masked during the subsequent processing to prevent further metal deposition thereon. Or, alternatively, the passive thin film element may be separately deposited just prior to the final step of etching away unwanted silicon substrate from the structure.

In connection with the final etching step the electrode surface of the device is mounted by waxing down to a mounting plate during the masking and etching processes which remove the underlying silicon and expose the beam leads. As disclosed in my copending applications noted above, a nitric acid-hydrofluoric acid etch is used to remove the silicon. For example, a suitable mixture for this purpose contains nineteen parts by volume of nitric acid to one part by volume of hydrofluoric acid. Although this etchant also attacks silicon oxide it does so at a much slower rate and therefore the process is readily terminated upon the removal of the silicon and before any significant removal of silicon oxide. These terminal points in the process are readily detectable by visual inspection and are well within the skill of those practiced in this art.

After removal of portions of the silicon substrate, areas of unsupported oxide web, which are not useful in accordance with this invention, may be removed by several alternative techniques, including abrasive cutting as well as by chemical etching in conjunction with suitable masking.

FIG. 2 illustrates, in schematic form, the use of the oxide web of a beam-lead structure as a vibratory member for translating acoustic energy to electrical form, as in a microphone. In particular, the silicon substrate is indicated by the separated segments 30 and 31. The silicon oxide web 32 forms the diaphragm of a microphone incorporated into an intergrated circuit device. One surface of the oxide film has a thin metal plating 35 of a metal such as tantalum or titanium. Opposite the unplated portion of the oxide web, and spaced therefrom, is a metal electrode member 39 which forms the opposite electrode of the capacitance microphone. Conveniently, this member is circular in cross-section as is the recess 33 in the semiconductor substrate, and the metal film 35 likewise is circular. The oxide web is coupled to the acoustic input by means of the sound pressure, indicated by the multiple arrows, against one side of the web. Illustrative of the advantages of integrating a microphone in this form is the connecting lead 36 from the film electrode 35 to the adjoining semiconductor substrate portion 31 which may include, for example, a transistor amplifier therein. Although shown simply in schematic form, it will be appreciated that such an acoustic vibratory element may be compactly associated with its own amplifying and translating circuit portions.

Furthermore, the thin oxide web, disclosed as a useful integrated circuit element in this application, when suitably coated to provide a mirror surface, may be arranged to modulate a light beam which is incident thereon. Thus, vibration of the web serves to modulate the beam in accordance with the acoustic input.

Finally, it will be understood that the foregoing embodiments are illustrative and that other arrangements may be devised by those skilled in the art which likewise will be within the spirit and scope of this invention.

Thus, it will be apparent that the invention contemplates the use of the silicon oxide web which is readily produced in connection with beam-lead devices, for the mounting of a variety of electrical circuit elements, any of which include a thin film of metal.

What is claimed is:

1. A semiconductor integrated circuit device having interconnecting beam leads comprising conductive metal interconnection members substantially in one plane and of sufficient thickness to independently support isolated portions of said device, a thin web of silicon oxide suspended between and supported wholly by a pair of said beam lead members, there being no semiconductor portion underlying said web, and an electrical element on said oxide web.

2. A device in accordance with claim 1 in which said electrical element mounted on said oxide web includes a thin film of metal.

3. A semiconductor device in accordance with claim 2 in which said electrical element on said oxide web has at least one terminal connected to a terminal of said integrated circuit device.

4. The semiconductor integrated circuit device in accordance with claim 3 in which said electrical element comprises a thin film resistor.

5. The semiconductor integrated circuit device in accordance with claim 3 in which said electrical element comprises a thin film capacitor.

References Cited

UNITED STATES PATENTS

| | | | |
|---|---|---|---|
| 2,981,877 | 4/1961 | Noyce | 317—235 |
| 3,138,744 | 6/1964 | Kilby | 317—101 |
| 3,205,555 | 9/1965 | Balde et al. | 29—25.42 |
| 3,235,945 | 2/1966 | Hall et al. | 29—155.5 |
| 3,345,210 | 10/1967 | Wilson | 117—212 |

JOHN W. HUCKERT, *Primary Examiner.*

R. F. SANDLER, *Assistant Examiner.*